(12) United States Patent
Subramanian et al.

(10) Patent No.: US 6,376,389 B1
(45) Date of Patent: Apr. 23, 2002

(54) METHOD FOR ELIMINATING ANTI-REFLECTIVE COATING IN SEMICONDUCTORS

(75) Inventors: Ramkumar Subramanian, San Jose; Minh Van Ngo; Kashmir Sahota, both of Fremont; Yongzhong Hu, San Jose; Hiroyuki Kinoshita, Sunnyvale; Fei Wang, San Jose; Wenge Yang, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 49 days.

(21) Appl. No.: 09/588,117

(22) Filed: May 31, 2000

(51) Int. Cl.⁷ .............................................. H01L 21/00
(52) U.S. Cl. ..................... 438/740; 438/735; 438/743
(58) Field of Search .................. 438/631, 634, 438/637, 638, 645, 672, 735, 737, 738, 740, 743, 744; 216/38, 67, 79

(56) References Cited

U.S. PATENT DOCUMENTS

| | | | |
|---|---|---|---|
| 6,008,120 A | 12/1999 | Lee | 438/634 |
| 6,265,319 B1 * | 7/2001 | Jang | 438/740 X |
| 6,277,755 B1 * | 8/2001 | Chen et al. | 438/740 X |

* cited by examiner

Primary Examiner—William A. Powell
(74) Attorney, Agent, or Firm—Mikio Ishimara

(57) ABSTRACT

The present invention provides a method for manufacturing a semiconductor device without the use of an anti-reflective coating. In one embodiment, electrical devices are formed on a semiconductor substrate. A material with a low dielectric constant such as an oxide is then deposited. The low dielectric layer is then covered with photoresist and photolithographically processed and subsequently developed. The low dielectric layer is then etched using the pattern formed on the photoresist and the photoresist is later removed. Because this process works in any similar circumstances, good examples of its application are the formation of both contacts and local interconnects.

8 Claims, 9 Drawing Sheets

METHOD FOR ELIMINATING ANTI-REFLECTIVE COATING IN SEMICONDUCTORS

CROSS-REFERENCE TO RELATED APPLICATION(S)

The present application contains subject matter related to a concurrently filed U.S. patent application by Ramkumar Subramanian, Wenge Yang, Marina V. Plat, and Lewis Shen entitled "SEMICONDUCTOR MANUFACTURING METHOD USING A BARC AS A PHOTOMASK". The related application is assigned to Advanced Micro Devices, Inc. and is identified by Ser. No. 09/586,556.

The present application contains subject matter related to a concurrently filed U.S. patent application by Ramkumar Subramanian, Minh Van Ngo, Suzette K. Pangrle, and Kashmir S. Sahota entitled "SEMICONDUCTOR MANUFACTURING METHOD USING A HIGH EXTINCTION COEFFICIENT DIELECTRIC PHOTOMASK". The related application is assigned to Advanced Micro Devices, Inc., is issued on Sep. 25, 2001, as U.S. Pat. No. 6,294,460 B1.

The present application also contains subject matter related to a concurrently filed U.S. patent application by Ramnkumar Subramanian, Minh Van Ngo, Suzette K. Pangrle, Kashmir S. Sahota, and Christopher F. Lyons entitled "METHOD FOR CREATING PARTIALLY UV TRANSPARENT ANTI-REFLECTIVE COATING FOR SEMICONDUCTORS". The related application is assigned to Advanced Micro Devices, Inc. and is identified by Ser. No. 09/588,119.

The present application also contains subject matter related to a concurrently filed U.S. patent application by Ramkumar Subramanian, Minh Van Ngo, Kashmir S. Sahota, YongZhong Hu, Hiroyuki Kinoshita, Fei Wang, and Wenge Yang entitled "METHOD FOR USING A LOW DIELECTRIC LAYER AS A SEMICONDUCTOR ANTI-REFLECTIVE COATING". The related application is assigned to Advanced Micro Devices, Inc. and is identified by Ser. No. 09/586,264.

TECHNICAL FIELD

The present invention relates generally to memory devices and more particularly to a method for eliminating the use of anti-reflective coatings in the creation of contacts and formation of local interconnects.

BACKGROUND ART

Memory devices, such as a Flash electrically erasable programmable read only memory (EEPROM), are a class of nonvolatile memory devices that are programmed by hot electron injection and erased by Fowler-Nordheim tunneling or ultra-violet (UV) light.

Each memory cell is formed on a semiconductor substrate (i.e., a silicon die or chip), having a heavily doped drain region and a source region embedded therein. The source region further contains a lightly doped deeply diffused region and a more heavily doped shallow diffused region embedded into the substrate. A channel region separates the drain region and the source region. The memory cell further includes a multi-layer structure, commonly referred to as a "stacked gate" structure or word line. The stacked gate structure typically includes: a thin gate dielectric layer or tunnel oxide layer formed on the surface of substrate overlying the channel region; a polysilicon floating gate overlying the tunnel oxide; an interpoly dielectric layer overlying the floating gate; and a polysilicon control gate overlying the interpoly dielectric layer. Additional layers, such as a silicide layer (disposed on the control gate), a poly cap layer (disposed on the silicide layer), and a silicon oxynitride layer (disposed on the poly cap layer) may be formed over the control gate. A plurality of Flash EEPROM cells may be formed on a single substrate.

After the formation of the memory cells, electrical connections, commonly known as "contacts", must be made to connect the stack gated structure, the source region and the drain regions to other part of the chip. The contact process starts with the formation of sidewall spacers around the stacked gate structures of each memory cell. An etch-stop layer, typically a nitride material such silicon nitride, is then formed over the entire substrate, including the stacked gate structure, using conventional techniques, such as chemical vapor deposition (CVD). A dielectric layer, generally of oxide, is then deposited over the nitride layer. A layer of photoresist is then placed over the dielectric layer and is photolithographically processed to form the pattern of contact openings. An anisotropic etch is then used to etch out portions of the dielectric layer using the pattern on the photoresist to form source and drain contact openings. The openings at this point reach to the etch stop layer so a second anisotropic etch is used to extend the contact openings to stop at the source and drain regions in the substrate. The photoresist is then stripped, and a conductive material, such as tungsten, is deposited over the dielectric layer and fills the source and drain contact openings to form so-called "self-aligned contacts" (conductive contacts). The substrate is then subjected to a chemical-mechanical polishing (CMP) process which removes the conductive material above the dielectric layer to form the conductive contacts.

In order to connect multiple memory cells together, connections on top of the contacts need to be made. The normal approach is often referred to as Local Interconnect(s) (LI(s)). LIs are used to connect two conductive elements of a semiconductor die. The term "local" refers to the proximity of the two elements with respect to one another. Typically, an etch stop layer is deposed on top of the contacts of devices on a semiconductor and a conductive dielectric or oxide layer is added on top of the etch stop layer. A layer of photoresist is then added and a pattern is formed on its surface using photolithography. Similar to the processes used to create the devices and their contacts, the conductive material is etched away using the pattern formed in the photoresist, and the excess photoresist layer is removed.

As semiconductor devices have shrunk in size, the industry has turned towards deep ultraviolet (DUV) lithography as a photolithographic process to pattern contact openings in sub-0.35 micron line geometry semiconductor devices.

A major obstacle to the miniaturization of semiconductors is the effect of reflectivity in the DWV lithographic and conventional i-line lithographic processes. Reflections occur at the junctions of materials and are influenced in part by the thickness of materials. Because the precision of the photolithographic process is sensitive to such reflections, reducing the reflections by lowering the reflectivity of materials under about 15% is essential. In particular, the differences in thickness caused by the polysilicon, metal, and poly/metal stacks has made small feature patterning and critical dimension (CD) control of photoresist very difficult. Such topography causes unpredictable swings in material reflectivity and needs to be reduced or dampened in some way in order to reduce semiconductor device size. Non-uniformities occurring when the dielectric layer undergoes CMP can increase the total reflectivity from the dielectric to the photoresist during photolithography and cause further disruptions in patterning To solve this problem, different anti-reflective coatings (ARCs) have been developed which work by phase shift cancellation of specific wavelengths to provide uniform resist patterning. Top anti-reflective coatings (TARCS) are placed on top of the photoresist and are specifically designed so that the reflective light from the resist/ARC interface is equal in amplitude but opposite in phase to the light reflected from the ARC/reflective layer interface.

It has been found that there are certain line width variations which are due to the ARC not being able to reduce the reflective layer reflectivity to a minimum. The reflectivity causes problems with the resist which have been corrected in part by the use of bottom anti-reflective coatings (BARCs) located under the resists. This effectiveness of this additional BARC layer is dependent on the thickness of the oxide layer below it. Although a BARC has the potential to significantly reduce the reflectivity and therefore refine the patterning process, there is a large oxide-thickness dependent swing in the reflectivity.

Another significant problem with ARCs is that they are not transparent to the ultra-violet light normally used when erasing Flash memories. As a result, after the conductive layer in the formation of contacts or local interconnects has occurred, the BARC layer needs to be removed.

Failing to remove the BARC layer would also create capacitance between contacts and interconnects because of its relatively high dielectric constant and would greatly reduce the transistor switching speed. This would add to the adverse speed impact which increases disproportionately with shortened channels. Basically, the parasitic capacitance due to lightly doped drain (LDD) structures as a percentage of the total transistor capacitance is higher for sub-0.18 micron transistors than it is for a 0.18 micron transistor and even worse for a sub-0.13 transistor, making the overall adverse speed impact much more severe in smaller transistors.

Although removal of the ARC is necessary for the above reasons, the actual removal process causes problems. The most significant problem is the cost and complexity in adding ARC removal steps.

Attempts have been made to develop a thin photoresist layer which would allow for the removal of ARC layers as a byproduct of existing etching steps, thus avoiding the additional cost of and complexity. However, it is extremely difficult to deposit and polish a sufficiently thin layer of defect-free photoresist.

Another problem is that the CMP that is used in the removal process of the BARC layer inherently removes portions of the conductive contacts as well as the dielectric layer, producing deep scratches therein. The scratches vary significantly from memory cell to memory cell, creating non-uniformity and adversely affecting device performance.

Rather than use CMP, attempts have been made to develop an etch chemistry that is more selective so that the ARC would be etched at a much higher rate than the conductive contacts and the dielectric layer. Unfortunately, these attempts have been unsuccessful.

A solution which would provide the precise patterning that ARCs provide without the inherent drawbacks in quality and time-consuming steps has long been sought but has eluded those skilled in the art. As the considerable demand in the field of semiconductors rises, it is becoming more pressing that a solution enabling semiconductor devices to be produced quickly and reliably be found to meet the demand.

DISCLOSURE OF THE INVENTION

The present invention provides a method of manufacturing a semiconductor device which eliminates the need for anti-reflective coatings (ARCs).

The present invention further provides a method for manufacturing a semiconductor device by using a material with a low dielectric constant for the low dielectric layer.

The present invention further provides a method for manufacturing a semiconductor device by using a material with optimized optical constants for the low dielectric layer, minimizing the reflectivity during the photolithographic process.

The present invention further provides a method for manufacturing a semiconductor device by using a well-known material with a low dielectric constant for the low dielectric layer such as Flare, BCB, or Silk.

The present invention further provides a method for manufacturing a semiconductor device by forming a plurality of devices on a semiconductor substrate. A nitride etch stop layer is then deposited evenly over the surface of the plurality of semiconductor devices. Next, a low dielectric layer is deposited and polished to form a planar surface and a layer of photoresist for patterning contacts and local interconnects (LI) is deposited thereon. The photoresist layer is then photolithographically processed to form a pattern which is then used to anisotropically etch the low dielectric layer down to the etch stop layer to form contacts and LI. A nitride etch is then used to remove the exposed portions of the etch stop layer and the photoresist layer is removed. Because there are no ARC layers, there do not need to be deposition processes to apply the layers and there do not need to be separate removal processes with the inherent risk of scratching the surface of the low dielectric layer below.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
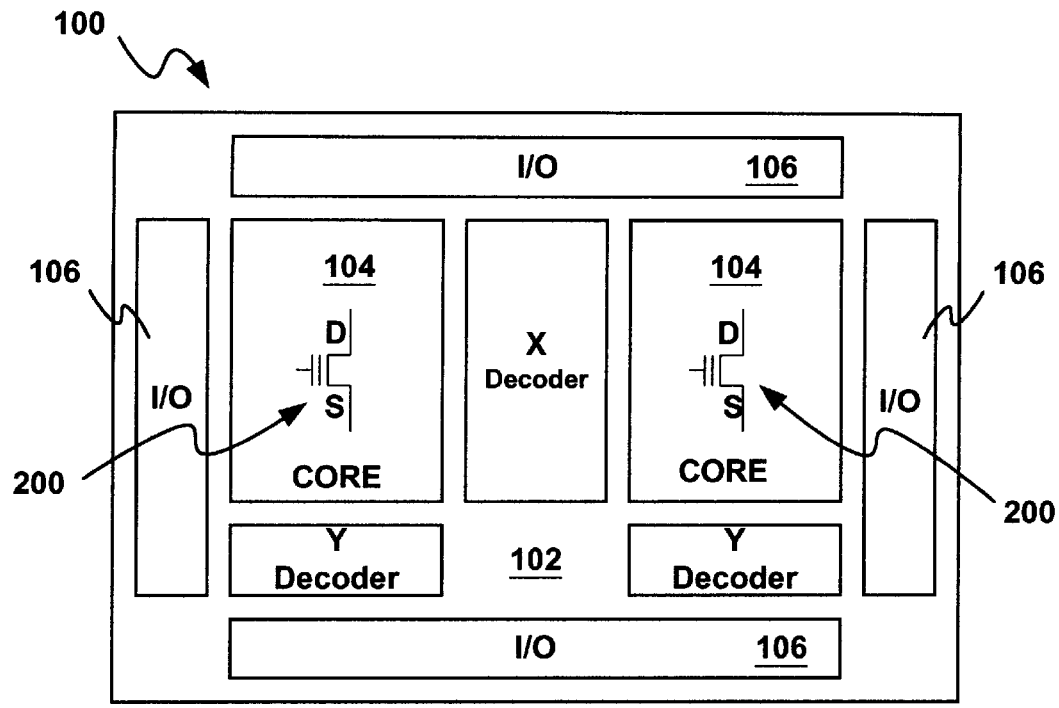
FIG. 1 (PRIOR ART) is a plan view of a conventional memory device.

Referring now to FIG. 1 (PRIOR ART), therein is shown a plan view of a conventional memory device, a Flash EEPROM 100 which commonly includes a semiconductor substrate 102 in which one or more high-density core regions and one or more low-density peripheral portions are formed. High-density core regions typically include one or more M×N array cores 104 of individually addressable, substantially identical memory cells 200. Low-density peripheral portions 106 typically include input/output (I/O) circuitry and circuitry for selectively addressing the individual memory cells. The selective addressing circuitry typically includes one or more x-decoders and y-decoders, cooperating with the I/O circuitry for connecting the source, gate, and drain of selected addressed memory cells to predetermined voltages or impedances, to effect designated operations on the memory cell, e.g., programming, reading and erasing, and deriving necessary voltages to effect such operations.

Figure 2A:
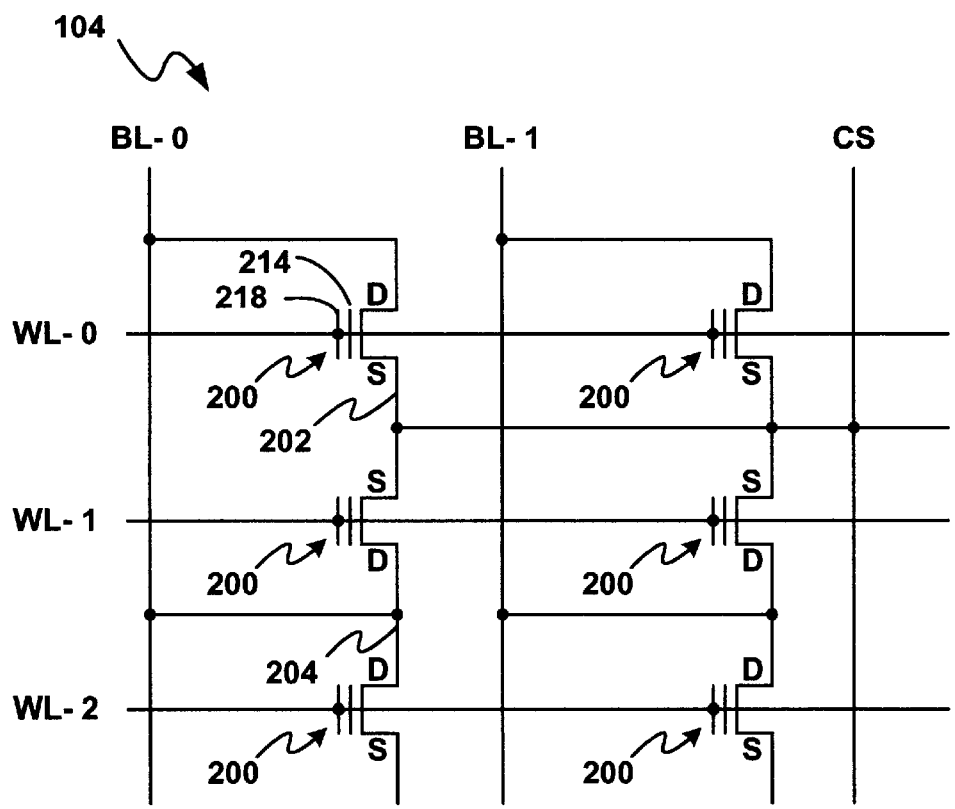
FIG. 2A (PRIOR ART) is schematic diagram of a portion of a memory cell array.
Figure 2B:
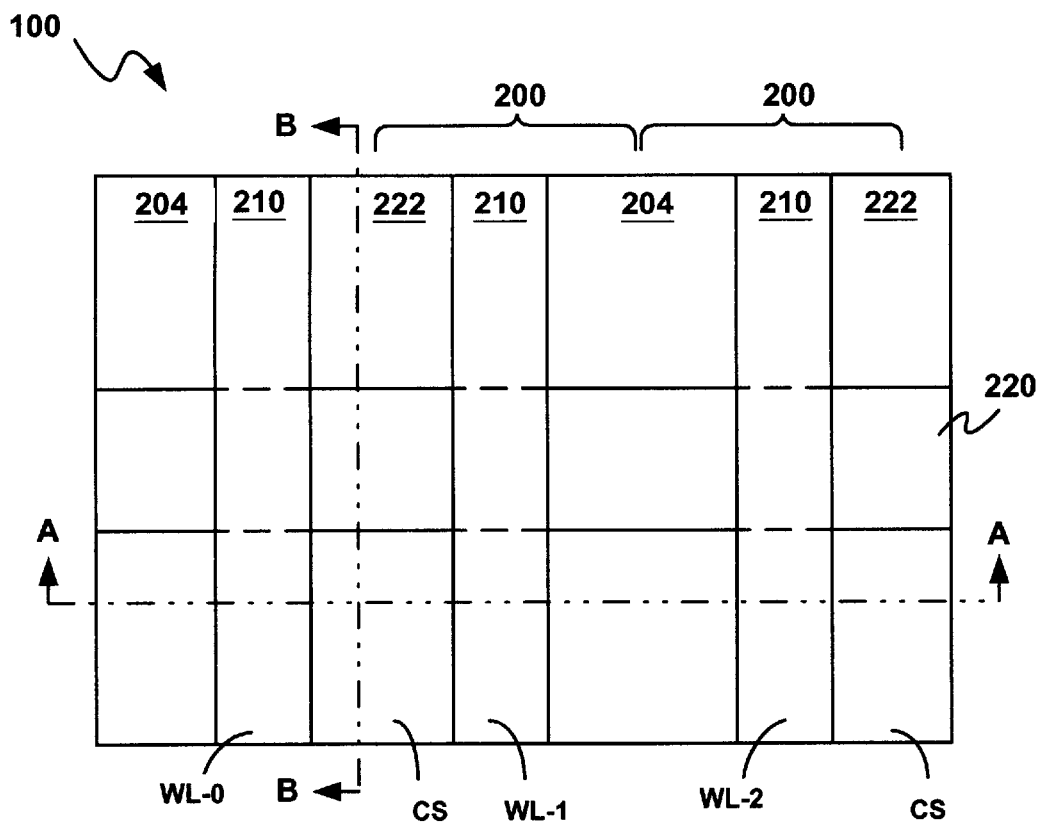
FIG. 2B (PRIOR ART) is a plan view of a portion of an intermediate state (partially complete) of a memory cell array core.
Figure 2C:
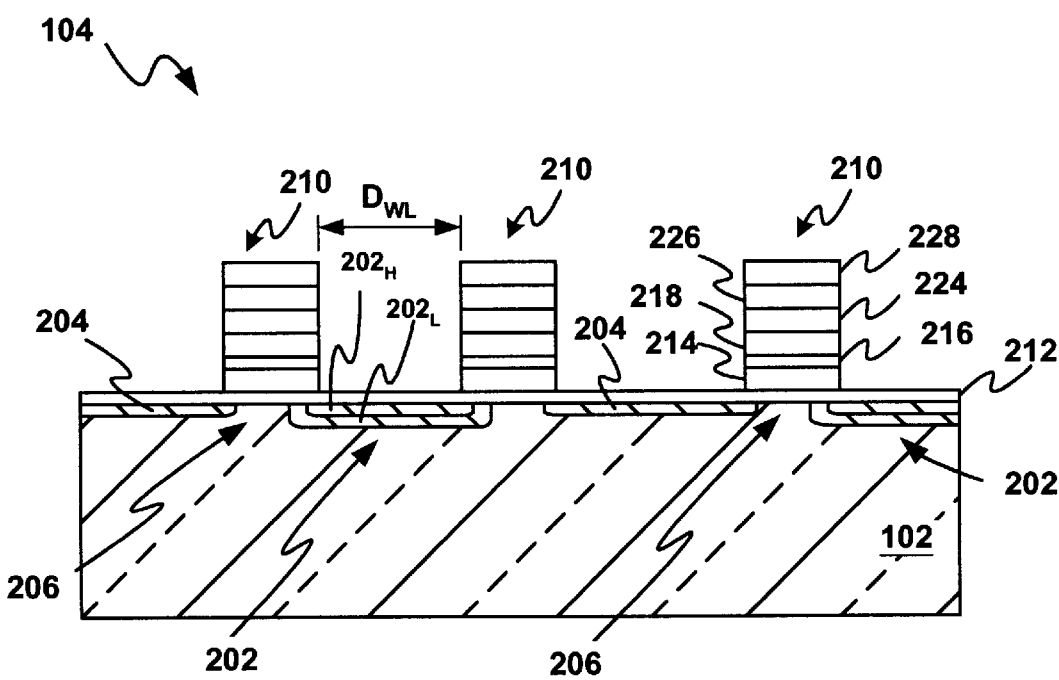
FIG. 2C (PRIOR ART) is a simplified cross section of FIG. 2B (PRIOR ART) along line A—A.
Figure 2D:
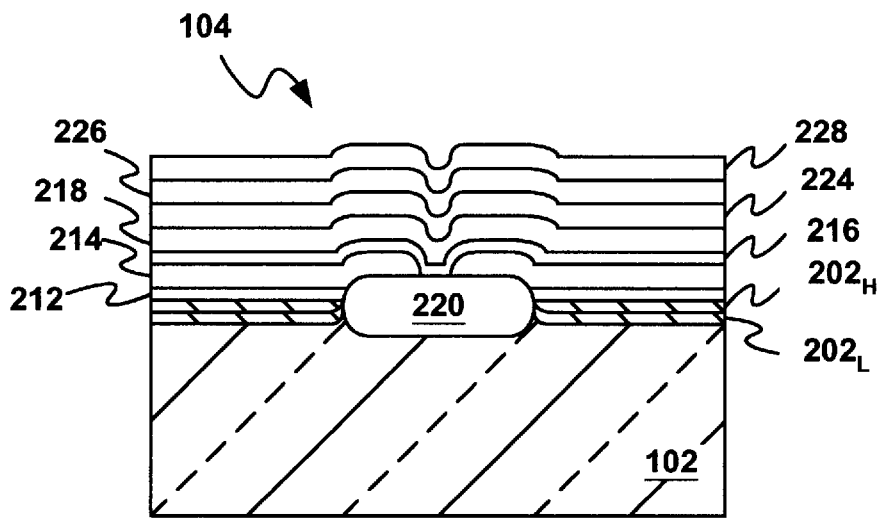
FIG. 2D (PRIOR ART) is a simplified cross section of FIG. 2B (PRIOR ART) along line B—B.

Referring now to FIG. 2A (PRIOR ART), therein is shown a schematic diagram of a portion of a memory cell array in which each memory cell 200 in array core 104 typically comprises a source 202, a drain 204, and a channel 206 (shown in FIG. 2C (PRIOR ART)).

Referring now to FIG. 2B (PRIOR ART), therein is shown a plan view of a portion of an intermediate state (partially complete) of a memory cell array core 104.

The memory cells 200 are arranged in a series of rows and columns.

In the completed array, the control gates 218 of the memory cells 200 in a row are formed integral to a common word line (WL) associated with the row. Columns of memory cells are arranged such that adjacent memory cells in a column share a common semiconductor region as a source or drain region. The source 202 of each memory cell in a column (except end memory cells) is formed in a common region with one of the adjacent memory cells, e.g., the preceding memory cell in the column. Likewise, the drain of the memory cell is formed in a common region with the drain 204 of the other adjacent memory cell, e.g., the next succeeding memory cell in the column (except end memory cells). The drain 204 of each memory cell in a column of memory cells is connected by a conductive bit line (BL) (FIG. 2A (PRIOR ART)), including an overlying layer of metal connected to each drain 204 of the memory cells 200 within the column. Additionally, the sources 202 of each memory cell 200 in a row (and hence pairs of rows) are interconnected by a common source line CS (FIG. 2A (PRIOR ART)) formed in the substrate 102, as will be described. Any particular memory cell 200 within the array cores 104 can be individually addressed (programmed and read) by operating upon one word line and one bit line.

Typically, in forming an EEPROM 100, a pattern of field oxide regions 220 (FIG. 2B (PRIOR ART)) is initially formed to provide electrical isolation between the respective devices of EEPROM 100. For example, field oxide regions 220 are used to provide isolation between the array cores 104 and the devices of peripheral portions 106, as well as between the various columns of memory cells 200 within the array cores 104. Field oxide regions 220 are conventionally formed using a mask and selective growth process: a layer of thermal oxide ("barrier oxide" or "pad oxide") is grown or deposited over the surface of the substrate 102; a mask, frequently composed of nitride, is deposited on the barrier oxide, and patterned to cover those regions of the substrate 102 in which devices are to be formed (herein-referred to as active regions); field oxide is grown in the exposed areas of the barrier oxide, by for example, the local oxidation of silicon (LOCOS); and the masking layer and barrier oxide are stripped to expose the underlying substrate 102. In general, referring to FIG. 2B (PRIOR ART), within the array cores 104, the selective growth process results in alternating parallel strips of field oxide regions 220 and exposed regions corresponding to the columns of memory cells 200 in the array.

The stacked gate (word line) structures 210 are then typically formed. For example, a gate dielectric layer 212, comprising a thin (e.g. approximately 100 angstroms) layer of oxide, is initially formed on the substrate 102 by a technique, such as thermal oxidation of the surface of the substrate 102 or by depositing a suitable material on the substrate 102. A layer of conductive polysilicon (e.g., polycrystalline silicon), that will ultimately form the floating gates 214, is typically then formed on the gate dielectric layer 212. For example, conductive polysilicon may be deposited by a number of different techniques, e.g., furnace-grown polysilicon. The polysilicon layer is typically then masked and etched to remove strips overlying the field oxide regions 220, leaving isolated strips of polysilicon on top of the gate dielectric layer 212 overlying the substrate regions corresponding to the columns of memory cells 200 of the array core 104 (i.e. the regions in which source, channel, and drain regions of memory cells in the column will be formed). A layer of dielectric material, such as, e.g., an oxide-nitride-oxide (ONO) layer, that will ultimately form an interpoly dielectric layer 216 is typically then formed by a suitable technique. For example, where the interpoly dielectric layer 216 is ONO, it is formed by growing a layer of oxide, depositing a layer of nitride, followed by growing another layer of oxide. The interpoly dielectric layer 216, in the completed array, insulates control gates 218 from floating gates 214 in the individual memory cells and electrically isolates the adjacent columns of the floating gates 214 in the array core 104. Another layer of conductive polysilicon (e.g., polycrystalline silicon), that will ultimately form the control gates 218 and the word lines WL connecting the control gates 218 of the memory cells in the respective rows of the array core 104, referred to as the control gate 218, is typically then thermally grown on the interpoly dielectric layer 216. Portions of the control gate 218 and the interpoly dielectric layer 216 are typically then selectively removed to define the stacked gate structures 210 on the gate dielectric layer 212, i.e., to form the floating gates 214, the interpoly dielectric layer 216, control gates 218 of the individual memory cells, and the word lines WL (portions of the interpoly dielectric layer 216 and control gate polysilicon layer bridge field oxide regions 220 to connect the respective memory cells of the rows of the core array). This is typically affected by masking and etching techniques.

When completed, this etch creates the generally parallel, stacked gate (word line) structures 210 separated by a distance DWL, as shown in FIG. 2C (PRIOR ART). A silicide layer 224 is typically provided over the control gate 218 layer to reduce resistance. Thereafter, a polysilicon layer (commonly referred to as a "poly cap" layer) 226 is formed over the silicide layer 224 to serve as a cap layer for the stacked gate structures 210. Next, a silicon oxynitride layer 228 may be formed over the poly cap layer 226. The combination of the poly cap layer 226 and the silicon oxynitride layer 228 is commonly referred to as a "passivation layer". Thereafter, portions of the silicon oxynitride layer 228 are partially removed using conventional masking and etching techniques to define the final stacked gate structures 210.

Conventionally, the portions of the field oxide regions 220 and the gate dielectric layer 212 between every second pair of adjacent stacked gate (word line) structures 210 in the array core 104 (i.e., the regions, generally indicated as 222, where the sources 202 are to be formed and the portions of the field oxide regions 220 disposed between sources 202 of the corresponding memory cells of adjacent columns) are then typically removed in preparation for formation of the common line CS (not shown)) connecting the sources 202. This is typically effected using a conventional Self-Aligned Source (SAS) etch.

Figure 3A:
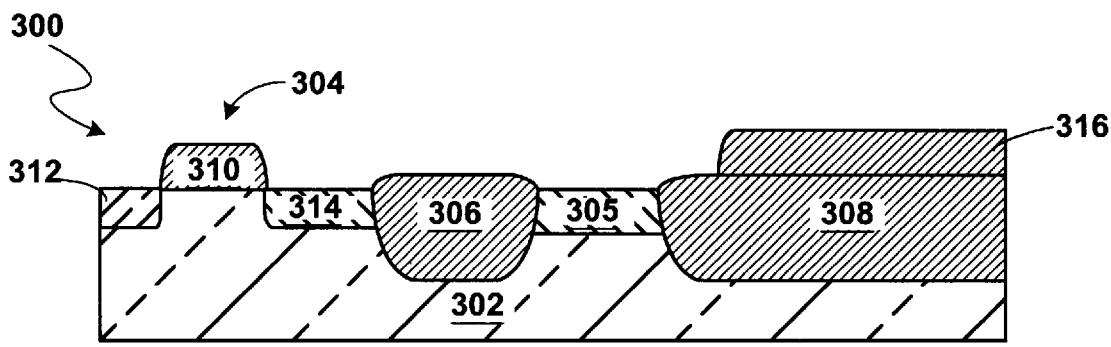
FIGS. 3A (PRIOR ART) through 3K (PRIOR ART) illustrate a partial sequence of process steps of a conventional process for forming an interconnect structure and its associate contact on a semiconductor substrate.

Referring now to FIG. 3A (PRIOR ART), therein is shown a cross section of a simplified semiconductor 300 in an intermediate stage of processing. At this stage are shown a P-type doped semiconductor substrate 302 with a N-channel transistor 304, an active region 305, and shallow trench isolations (STI) 306 and 308. Included in the transistor 304 are a polysilicon gate 310, a source region 312, and a drain region 314. Another polysilicon gate 316 is shown disposed atop STI 308. STI 306 electrically isolates N-channel transistor 304 and the active region 305. Similarly, STI 308 electrically isolates the active region 305 and the polysilicon gate 316. In a typical process to form contacts and interconnect structures, a contact will be formed on the drain region 314, a Local Interconnect (LI) will be formed between the active region 405 and the polysilicon gate 416, and, although not shown, another contact will be formed on the LI. For purposes of illustration, transistor 304 and active region 305 represent elements of a logic device, while polysilicon gate 316 represents an element of a memory device.

Figure 3B:
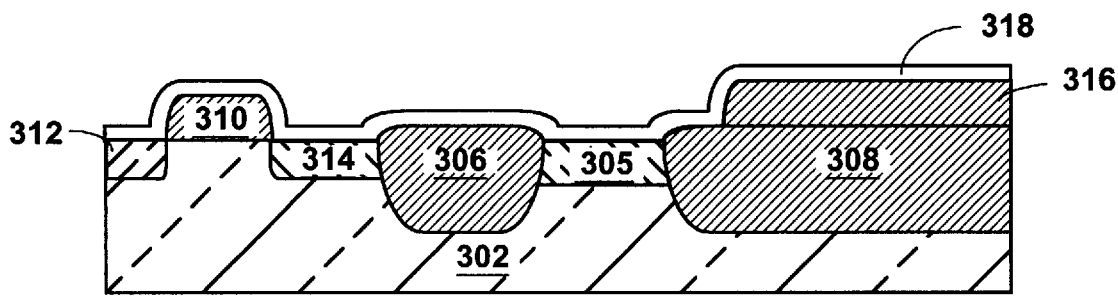

Referring now to FIG. 3B (PRIOR ART), therein is shown the deposition of a nitride based LI etch stop layer 318 over the entire surface of the semiconductor substrate 302.

Figure 3C:
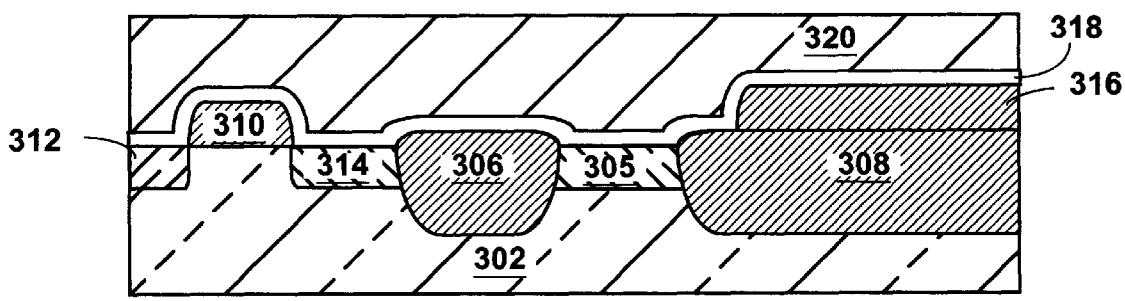

Referring now to FIG. 3C (PRIOR ART), therein is shown the deposition of a dielectric layer 320, such as an oxide, over the entire surface of the semiconductor substrate 302 after it has been deposited and undergone chemical-mechanical polishing (CMP) to planarize the surface.

Figure 3D:
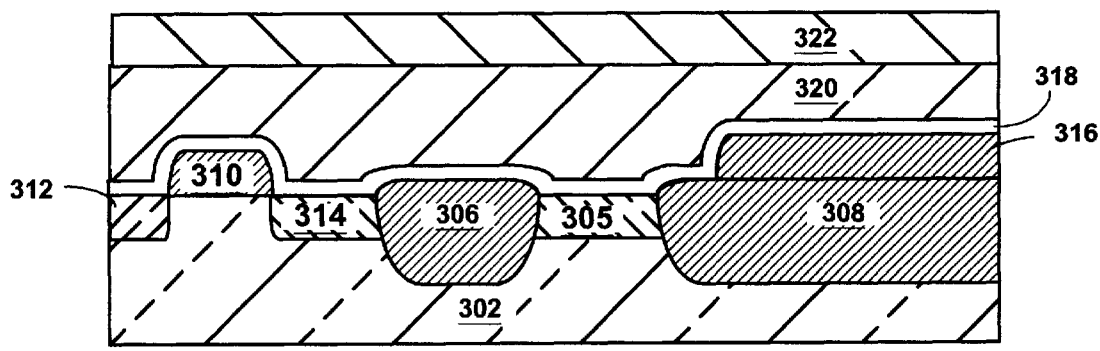

Referring now to FIG. 3D (PRIOR ART), therein is shown the deposition of a bottom anti-reflective coating (BARC) 322 over the surface of the planarized dielectric layer 320

Figure 3E:
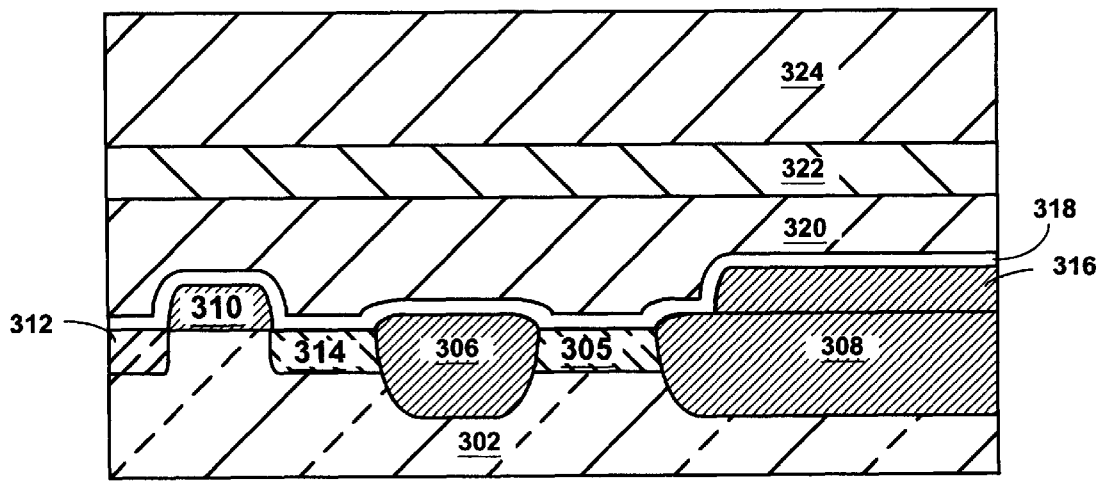

Referring now to FIG. 3E (PRIOR ART), therein is shown the formation of a photoresist layer 324 on the planarized dielectric layer 322. The photoresist layer 324 is typically formed by spinning a photoresist material on the dielectric layer 320. The BARC 322 is typically directly underneath the layer of photoresist 324. Because of its low reflectivity, the BARC 322 has the potential to greatly improve the precision of patterning and thus allow for smaller semiconductor devices.

Figure 3F:
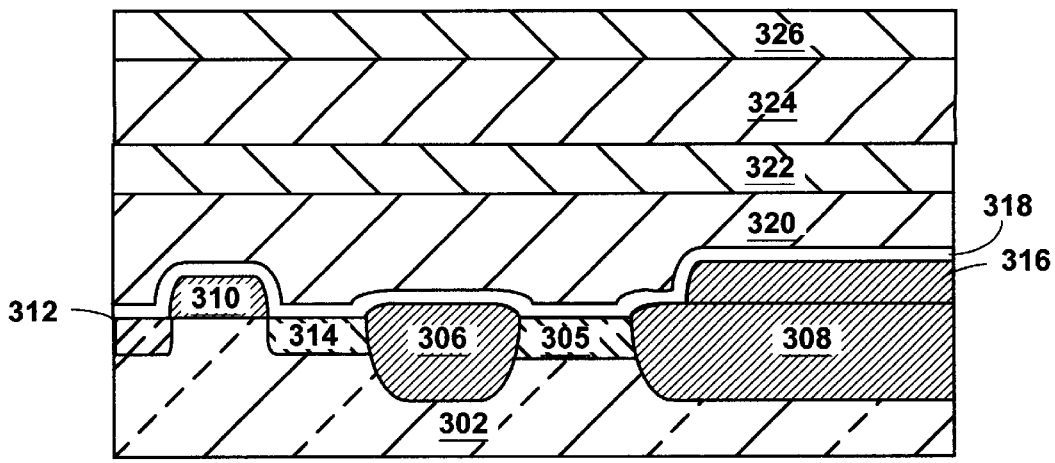

Referring now to FIG. 3F (PRIOR ART), therein is shown the deposition of a top anti-reflective coating (TARC) 326.

Figure 3G:
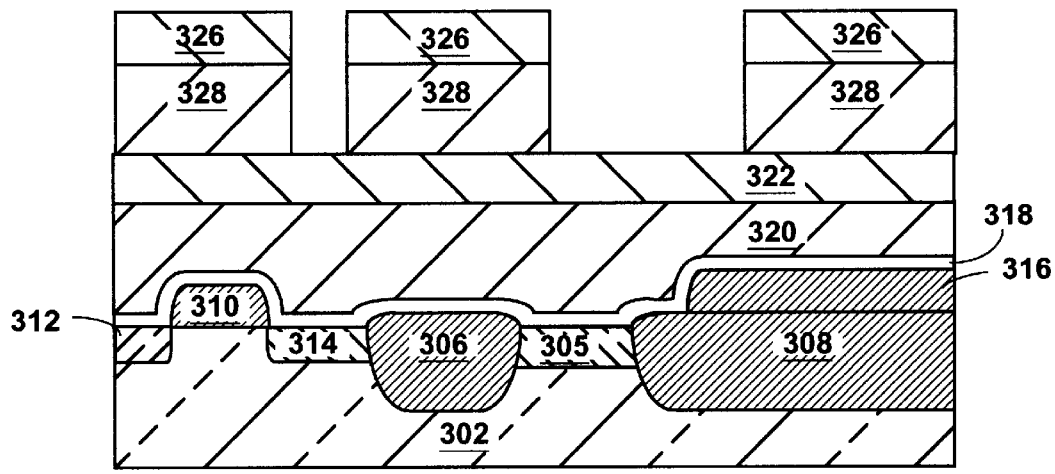

Referring now to FIG. 3G (PRIOR ART), therein is shown the patterning and developing of the photoresist layer 324 through the TARC 326 to form a LI mask 328.

Figure 3H:
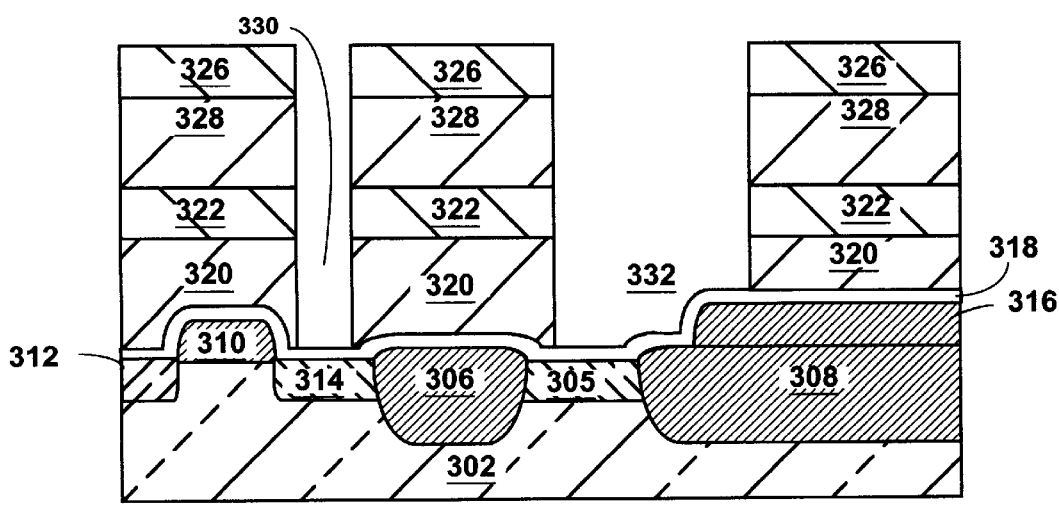

Referring now to FIG. 3H (PRIOR ART), therein is shown the formation of contact opening 330 and LI opening 332 in the BARC 322 and the dielectric layer 320 by using a conventional dielectric etch technique. The etch stop layer 318 stops the etching process.

Figure 3I:
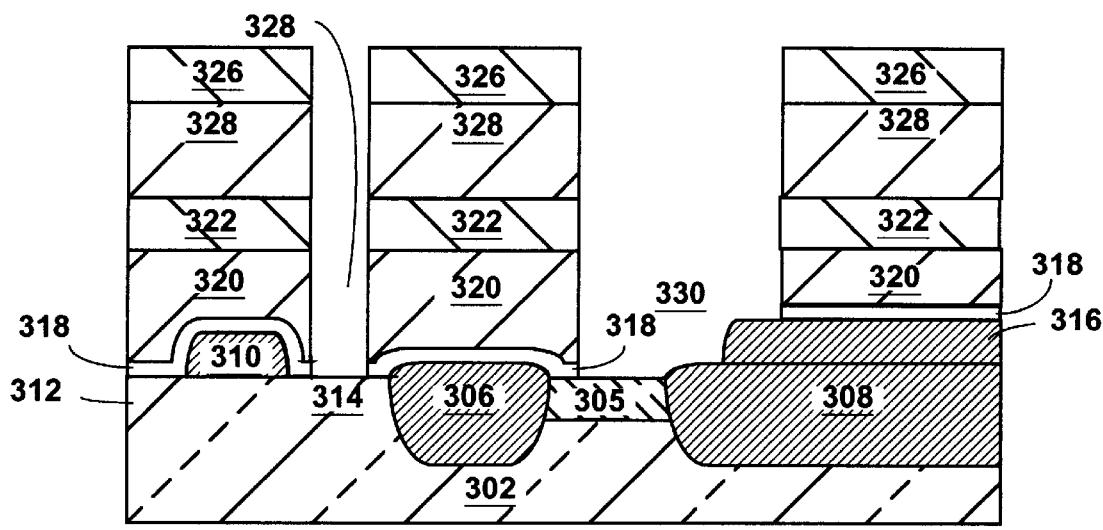

Referring now to FIG. 3I (PRIOR ART), therein is shown the removal of the exposed etch stop layer 318.

Figure 3J:
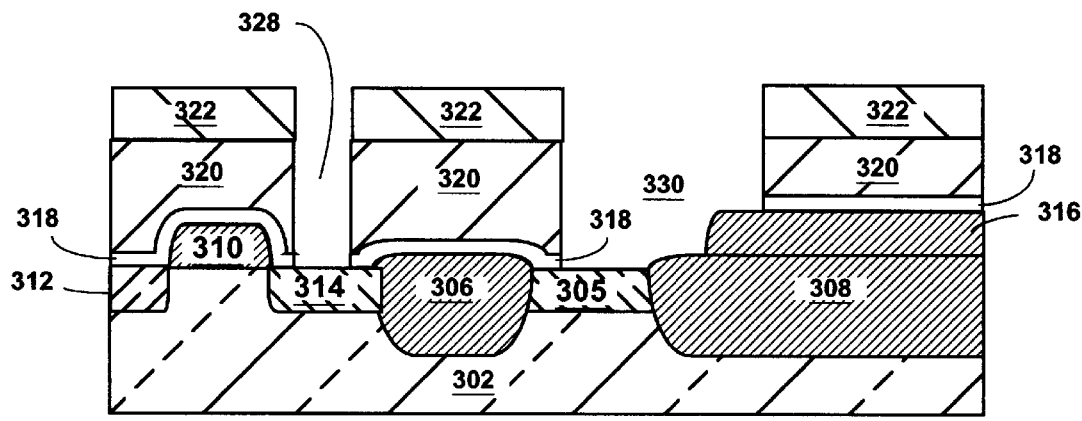

Referring now to FIG. 3J (PRIOR ART), therein is shown the removal of the LI mask 328 and TARC 326 using a conventional etch technique.

Figure 3K:
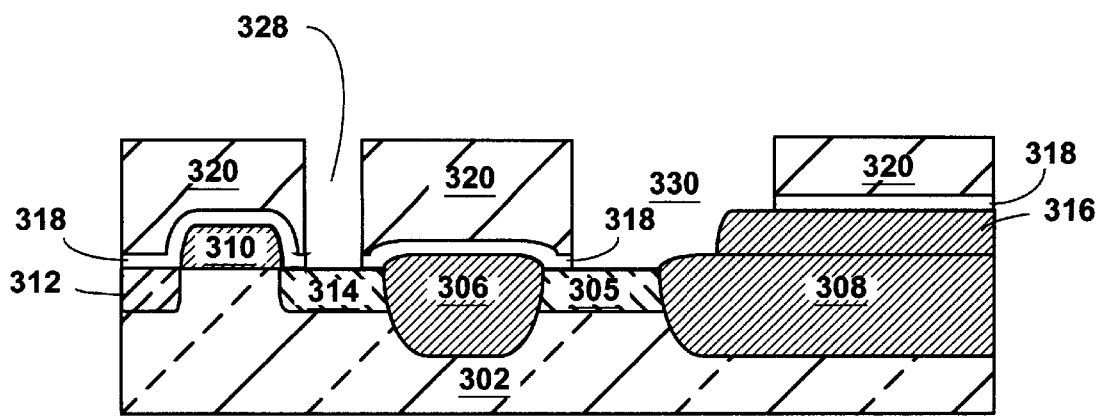

Referring now to FIG. 3K (PRIOR ART), therein is shown the removal of the BARC 322 in a separate etching or CMP step. The process of forming an interconnect structure and its associated contacts on a semiconductor substrate also involves many other steps including filling the contact opening 330 and LI opening 332 with a conductive metal, further creation of contacts, and the formation of a complete interconnect structure, however, illustration of these steps is not required for the description of the present invention.

Figure 4A:
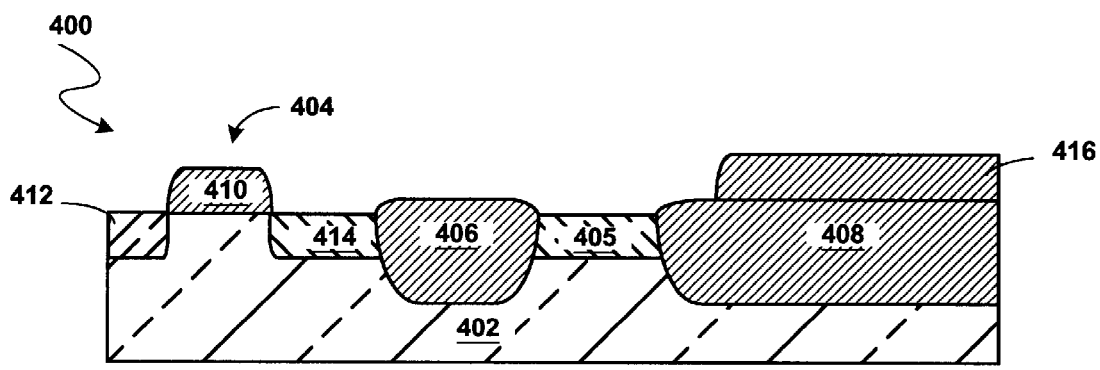
FIGS. 4A through 4I illustrate the sequence of steps of a process in accordance with the present invention for forming an interconnect structure and its associate contact on a semiconductor substrate without the use of ARC layers.

Referring now to FIG. 4A, therein is shown a cross section of a simplified semiconductor 300 in an intermediate stage of processing. At this stage, the semiconductor is identical to that of FIG. 3A (PRIOR ART) and depicts a P-type doped semiconductor substrate 402 with a N-channel transistor 404, an active region 405, and shallow trench isolations (STI) 406 and 408. Included in the transistor 404 are a polysilicon gate 410, a source region 412, and a drain region 414. Another polysilicon gate 416 is shown disposed atop STI 408. STI 406 electrically isolates N-channel transistor 404 and the active region 405. Similarly, STI 408 electrically isolates the active region 405 and the polysilicon gate 416. In a typical process to form contacts and interconnect structures, a contact will be formed on the drain region 414, a Local Interconnect (LI) will be formed between the active region 405 and the polysilicon gate 416, and, although not shown, another contact will be formed on the LI. For purposes of illustration, transistor 404 and active region 405 represent elements of a logic device, while polysilicon gate 416 represents an element of a memory device. The method of the present invention is not limited in scope to the example illustrated here and can apply to any semiconductor devices using similar processes.

Figure 4B:
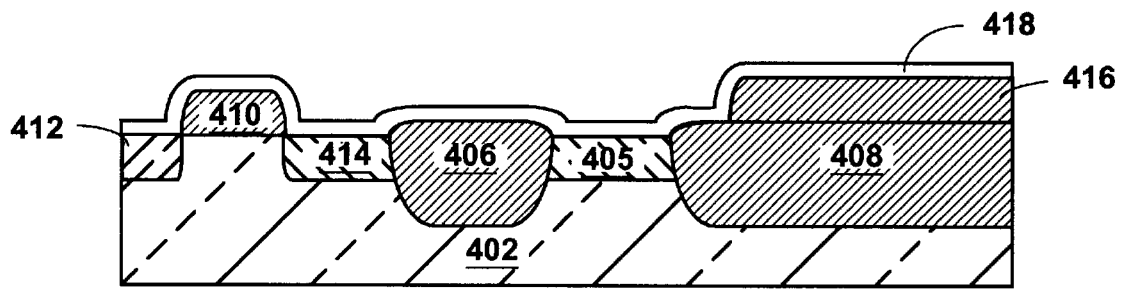

Referring now to FIG. 4B, therein is shown the deposition of an etch stop layer 418 over the entire surface of the semiconductor substrate 402. The etch stop layer 418 is typically a nitride based material that stays intact during the dielectric etching process that etches away other layers.

Figure 4C:
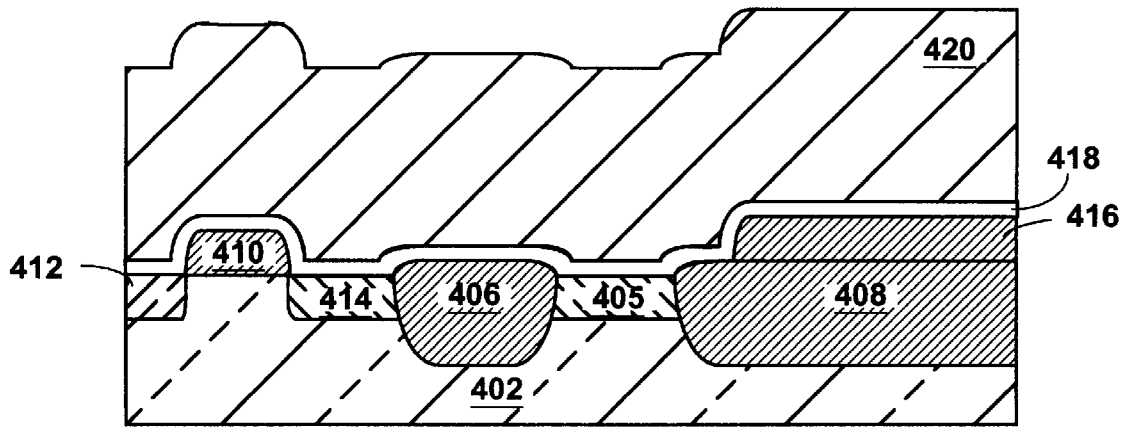

Referring now to FIG. 4C, therein is shown a low dielectric layer 420 deposited over the entire surface of the semiconductor substrate 402. The low dielectric layer is composed of a well-known material with a low dielectric constant such as Flare, BCB, or Silk. These materials have optical constants that can be optimized to reduce their reflectivity BY REDUCING THEIR SILICON CONTENT BELOW 15%. During the photolithographic process that develops the photoresist, this low reflectivity reduces reflections and renders anti-reflective coatings unnecessary.

Figure 4D:
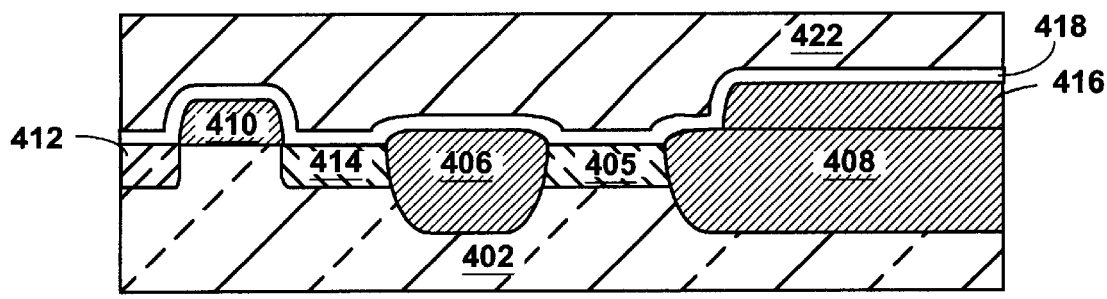

Referring now to FIG. 4D, therein is shown the chemical-mechanical polishing (CMP) of the low dielectric layer 420 to form a planarized low dielectric layer 422.

Figure 4E:
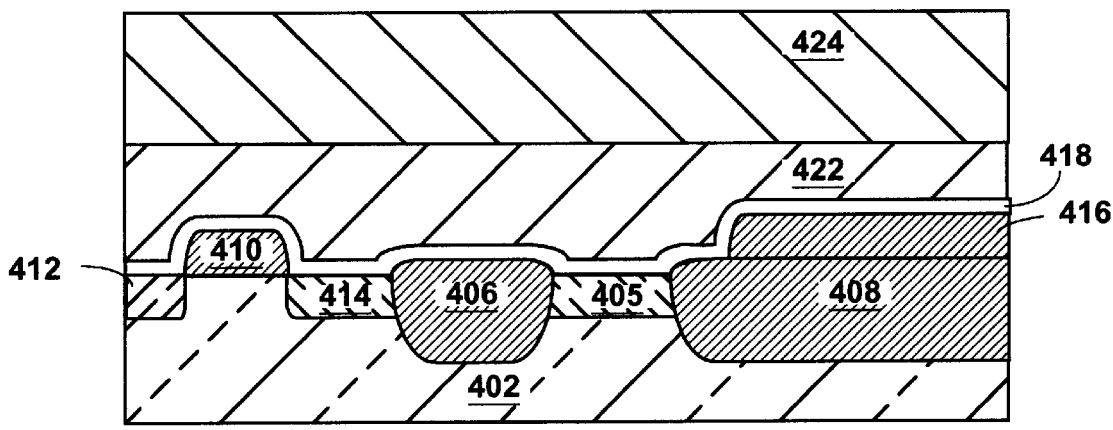

Referring now to FIG. 4E, therein is shown the formation of a photoresist layer 424 on the planarized low dielectric layer 422. The photoresist layer 424 is typically formed by spinning a photoresist material on the planarized low dielectric layer 422. Because the present invention does not require the anti-reflective coatings shown being deposited in FIG. 3F and FIG. 3D, the steps of adding anti-reflective layers are unnecessary.

Figure 4F:
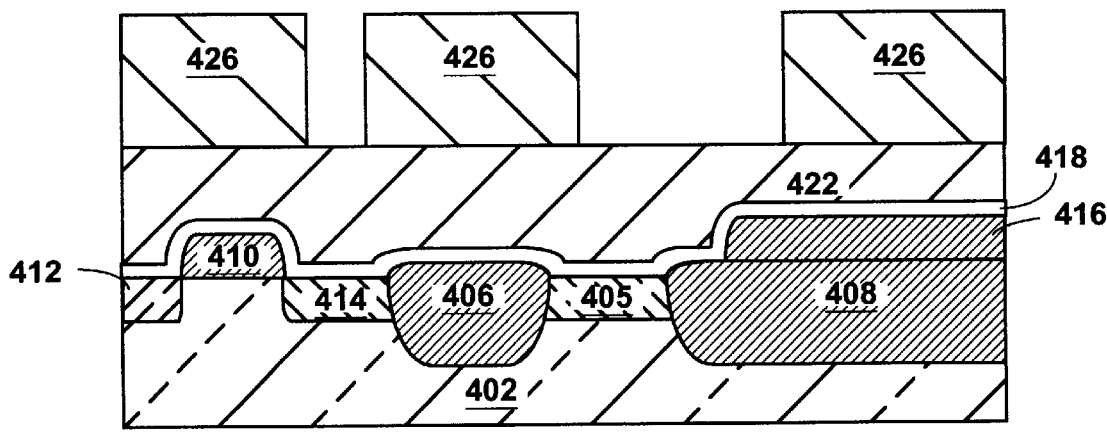

Referring now to FIG. 4F, therein is shown the patterning of the photoresist layer 424 to form a LI mask 426.

Figure 4G:
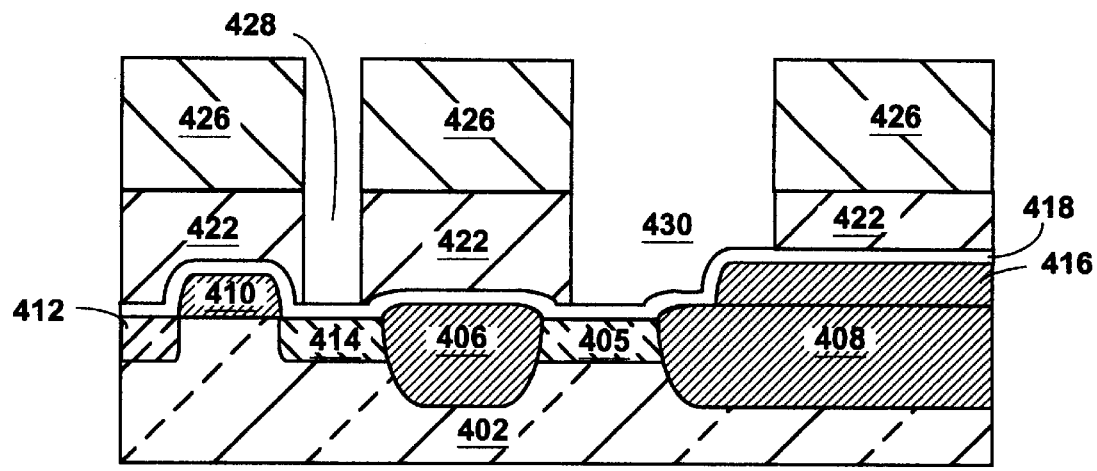

Referring now to FIG. 4G, therein is shown the formation of contact opening 428 and LI opening 430 in the planarized low dielectric layer 422 by using a conventional dielectric etch technique. The etch stop layer 418 stops the etching process to promote even etching of contacts and local interconnects.

Figure 4H:
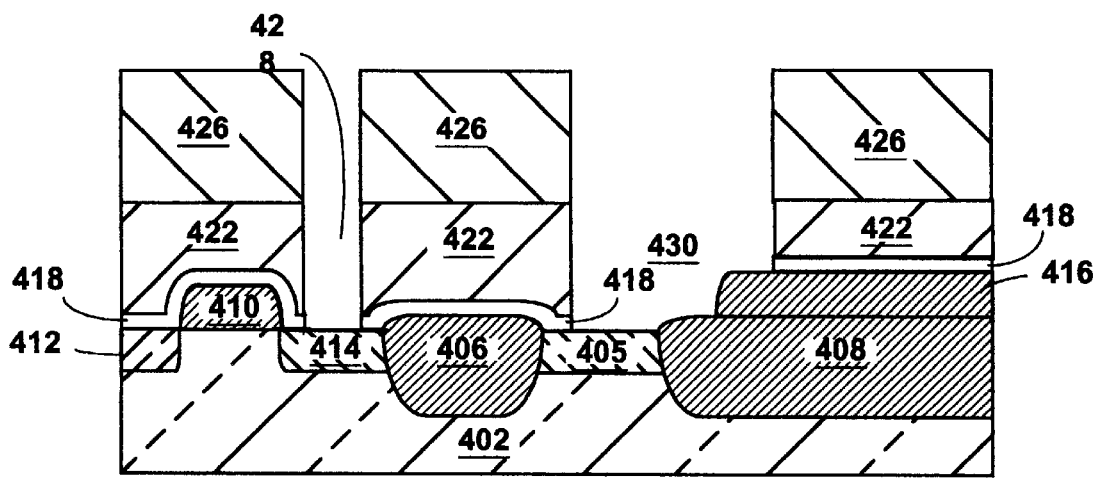

Referring now to FIG. 4H, therein is shown the removal of the exposed etch stop layer 418.

Figure 4I:
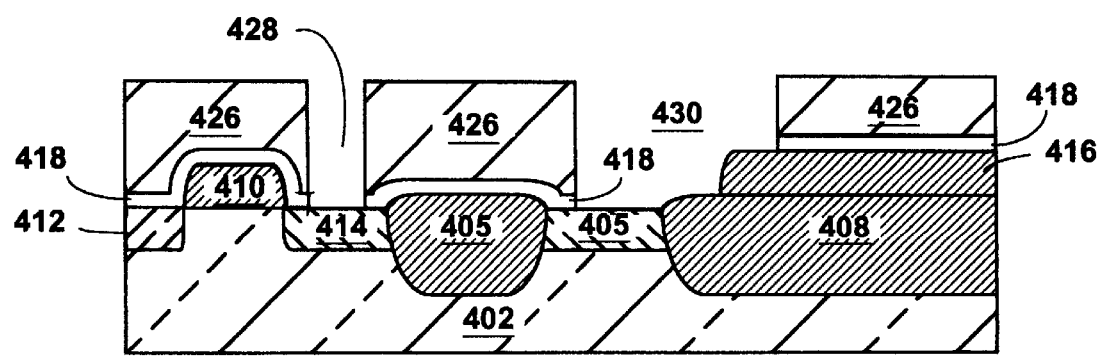

Referring now to FIG. 4I, therein is shown the removal of the LI mask 426 using a conventional etch technique. Because the present invention does not require anti-reflective coatings, the steps of removing those layers are unnecessary.

The process of forming an interconnect structure and its associated contacts on a semiconductor substrate also involves many other steps including filling the contact opening 328 and LI opening 330 with a conductive metal, further creation of contacts, and the formation of a complete interconnect structure, however, illustration of these steps is not required for the description of the present invention.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor comprising the steps of:

providing a semiconductor substrate;

forming a plurality of semiconductor devices on and in the semiconductor substrate;

depositing an etch stop layer over the plurality of semiconductor devices;

depositing a low dielectric layer over the etch stop layer;

planarizing the low dielectric layer to form a planar surface;

depositing a layer of photoresist over the low dielectric layer;

processing the photoresist to provide patterned openings therein for forming connections for the semiconductor device;

etching the pattern from the photoresist through the low dielectric layer to the etch stop layer;

etching the etch stop layer in the pattern created by the patterned photoresist and low dielectric layer;

filling the openings formed by etching with a conductive material, thus forming local interconnects for the semiconductor device, and removing the excess photoresist.

2. The method of manufacturing a semiconductor as claimed in claim 1 wherein the step of depositing a low dielectric layer uses a material having a dielectric constant below 4.0.

3. The method of manufacturing a semiconductor as claimed in claim 1 wherein the low dielectric layer has optical constants which can be optimized to reduce reflectivity.

4. The method of manufacturing a semiconductor as claimed in claim 1 wherein the low dielectric layer has optical constants optimized to bring the reflectivity during the photolithographic process used in patterning the photoresist layer below 15%.

5. A method of manufacturing a semiconductor comprising the steps of:

providing a silicon substrate;

forming a plurality of semiconductor devices on and in the silicon substrate, said plurality of semiconductor devices having a plurality of source and drain junctions and gates;

depositing an nitride etch stop layer over the plurality of source and drain junctions and gates on the plurality of semiconductor devices;

depositing an low dielectric layer over the contacts;

planarizing the low dielectric layer to form a planar surface;

depositing a layer of photoresist over the low dielectric layer;

processing the photoresist to provide patterned openings therein for forming local interconnects;

etching the pattern from the photoresist through the low dielectric layer and to the etch stop layer;

filling the openings formed by etching with a conductive material, thus forming local interconnects for the semiconductor device, and removing the excess photoresist.

6. The method of manufacturing a semiconductor as claimed in claim 5 wherein the step of depositing a low dielectric layer uses a material having a dielectric constant below 4.0.

7. The method of manufacturing a semiconductor as claimed in claim 5 wherein the low dielectric layer has optical constants which can be optimized to reduce reflectivity.

8. The method of manufacturing a semiconductor as claimed in claim 5 wherein the low dielectric layer has optical constants optimized to bring the reflectivity during the photolithographic process used in patterning the photoresist layer below 15%.

* * * * *